(12) United States Patent
Sung et al.

(10) Patent No.: US 11,384,433 B2
(45) Date of Patent: Jul. 12, 2022

(54) GAS INJECTION MODULE, SUBSTRATE PROCESSING APPARATUS, AND METHOD OF FABRICATING SEMICONDUCTOR DEVICE USING THE SAME

(71) Applicant: SAMSUNG ELECTRONICS CO., LTD., Suwon-si (KR)

(72) Inventors: Minkyu Sung, Hwaseong-si (KR); Sung-Ki Lee, Hwaseong-si (KR); Dougyong Sung, Seoul (KR); Sang-Ho Lee, Hwaseong-si (KR); Kangmin Jeon, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 44 days.

(21) Appl. No.: 17/159,244

(22) Filed: Jan. 27, 2021

(65) Prior Publication Data

US 2021/0147982 A1 May 20, 2021

Related U.S. Application Data

(63) Continuation of application No. 16/509,946, filed on Jul. 12, 2019, now Pat. No. 10,934,621.

(30) Foreign Application Priority Data

Nov. 21, 2018 (KR) .................. 10-2018-0144454

(51) Int. Cl.
*H01L 21/67* (2006.01)
*C23C 16/455* (2006.01)
(Continued)

(52) U.S. Cl.
CPC .. *C23C 16/45565* (2013.01); *C23C 16/45574* (2013.01); *C23C 16/45578* (2013.01);
(Continued)

(58) Field of Classification Search
CPC ........ C23C 16/45565; C23C 16/45574; C23C 16/45578; C23C 16/509; C23C 16/45561;
(Continued)

(56) References Cited

U.S. PATENT DOCUMENTS 5,500,256 A * 3/1996 Watabe ............. C23C 16/45561
427/579
5,950,925 A * 9/1999 Fukunaga ......... C23C 16/45512
239/132.3

(Continued)

FOREIGN PATENT DOCUMENTS

KR   10-2016-0050821 A1   5/2016

*Primary Examiner* — Rudy Zervigon
(74) *Attorney, Agent, or Firm* — Volentine, Whitt & Francos, PLLC

(57) ABSTRACT

A gas injection module includes a showerhead having first injection holes on a first region of the showerhead and second injection holes on a second region of the showerhead, the second region being outside the first region, a first distribution plate on the showerhead and having first and second upper passages respectively connected to the first and second injection holes, and a flow rate controller on the first and second upper passages of the first distribution plate. The flow rate controller reduces a difference in pressure within the first and second upper passages so that the gas may have similar flow rates within the first and second injection holes.

20 Claims, 6 Drawing Sheets

(51) Int. Cl.
*H01L 21/683* (2006.01)
*H01J 37/32* (2006.01)
*C23C 16/509* (2006.01)

(52) U.S. Cl.
CPC ...... *C23C 16/509* (2013.01); *H01J 37/32449* (2013.01); *H01L 21/6833* (2013.01)

(58) Field of Classification Search
CPC .......... H01J 37/32449; H01J 2237/334; H01L 21/6833; H01L 21/67069; H01L 21/67253; H01L 21/3065; H01L 21/67242
USPC ... 427/569, 570, 533, 535, 96.8, 237, 248.1, 427/255.23, 255.28; 216/58, 67
See application file for complete search history.

(56) References Cited

U.S. PATENT DOCUMENTS

| | | | | |
|---|---|---|---|---|
| 5,958,140 A * | 9/1999 | Arami | ............... | C23C 16/45502 118/725 |
| 6,821,910 B2 * | 11/2004 | Adomaitis | .......... | C23C 16/4412 118/715 |
| 7,252,716 B2 * | 8/2007 | Kim | ................... | C23C 16/4558 118/715 |
| 7,306,829 B2 | 12/2007 | Turlot et al. | | |
| 7,384,876 B2 | 6/2008 | Strang | | |
| 7,431,859 B2 * | 10/2008 | Bera | ..................... | H01J 37/321 156/345.34 |
| 7,540,971 B2 * | 6/2009 | Bera | ..................... | H01J 37/321 156/345.34 |
| 7,541,292 B2 * | 6/2009 | Bera | ................. | H01J 37/32091 216/37 |
| 7,662,232 B2 * | 2/2010 | Kobayashi | .......... | H01J 37/3244 118/715 |
| 7,708,859 B2 * | 5/2010 | Huang | ............... | H01J 37/32449 156/345.34 |
| 7,892,358 B2 * | 2/2011 | Suzuki | ................. | C23C 16/45574 118/715 |
| 7,896,967 B2 * | 3/2011 | Hayasaka | .............. | C23C 16/455 118/715 |
| 8,066,895 B2 * | 11/2011 | Belen | ................ | C23C 16/45565 216/67 |
| 8,187,415 B2 * | 5/2012 | Kim | ..................... | H01J 37/321 156/345.44 |
| 8,231,799 B2 * | 7/2012 | Bera | ................. | H01J 37/32449 216/67 |
| 8,236,133 B2 * | 8/2012 | Katz | ................. | H01J 37/32449 156/345.33 |
| 8,343,876 B2 * | 1/2013 | Sadjadi | ............. | H01J 37/32091 438/706 |
| 8,397,668 B2 * | 3/2013 | Kobayashi | ........ | H01J 37/32082 118/723 E |
| 8,430,962 B2 * | 4/2013 | Masuda | .............. | H01L 21/3065 118/715 |
| 8,512,511 B2 | 8/2013 | Himori et al. | | |
| 8,539,908 B2 * | 9/2013 | Takagi | .............. | C23C 16/45574 118/696 |
| 8,673,785 B2 * | 3/2014 | Huang | ............... | C23C 16/45561 438/696 |
| 8,679,255 B2 * | 3/2014 | Masuda | ............. | H01L 21/67069 118/715 |
| 8,733,282 B2 * | 5/2014 | Kobayashi | ........ | H01L 21/3065 118/723 E |
| 8,771,418 B2 * | 7/2014 | Je | ..................... | C23C 16/45565 118/715 |
| 8,790,529 B2 * | 7/2014 | Hayasaka | ................ | F17D 1/02 216/58 |
| 8,821,742 B2 * | 9/2014 | Yoshida | .............. | H01J 37/3244 216/67 |
| 8,882,913 B2 * | 11/2014 | Byun | ................ | C23C 16/45514 118/715 |
| 8,906,193 B2 * | 12/2014 | Mizusawa | ......... | H01J 37/32449 156/345.26 |
| 9,038,567 B2 * | 5/2015 | Kobayashi | .............. | C23C 16/50 118/723 E |
| 9,234,775 B2 | 1/2016 | Larson et al. | | |
| 9,396,964 B2 | 7/2016 | Matsuura | | |
| 9,425,028 B2 * | 8/2016 | Kuwabara | ......... | H01J 37/32036 |
| 9,441,791 B2 * | 9/2016 | Mizusawa | ............... | C23C 16/52 |
| 9,460,893 B2 * | 10/2016 | Kawamata | .......... | C23C 16/4558 |
| 9,466,468 B2 * | 10/2016 | Okayama | ........... | H01J 37/3244 |
| 9,466,506 B2 * | 10/2016 | Masuda | ............ | H01L 21/31116 |
| 9,469,900 B2 * | 10/2016 | Byun | ................. | C23C 16/45572 |
| 9,476,121 B2 * | 10/2016 | Byun | ................. | C23C 16/45578 |
| 9,644,267 B2 * | 5/2017 | Burrows | ........... | C23C 16/45565 |
| 9,677,176 B2 * | 6/2017 | Chandrasekharan | ........................ | C23C 16/45572 |
| 9,732,909 B2 * | 8/2017 | Hayasaka | ......... | H01L 21/67069 |
| 9,803,282 B2 * | 10/2017 | Yamada | ................ | C30B 25/165 |
| 9,887,108 B2 * | 2/2018 | Uchida | ................ | H01J 37/3244 |
| 10,145,012 B2 * | 12/2018 | Je | ........................... | C23C 16/52 |
| 10,199,241 B2 * | 2/2019 | Uchida | ............. | H01L 21/67069 |
| 10,221,483 B2 * | 3/2019 | Shah | ................ | H01L 21/67115 |
| 10,378,108 B2 * | 8/2019 | Wang | ................ | C23C 16/4401 |
| 10,403,476 B2 * | 9/2019 | Gregor | .............. | C23C 16/45565 |
| 10,494,717 B2 * | 12/2019 | Sung | ................ | C23C 16/45565 |
| 10,604,841 B2 * | 3/2020 | Batzer | ............... | H01J 37/32357 |
| 10,626,500 B2 * | 4/2020 | Shah | ................... | C23C 16/458 |
| 10,692,743 B2 * | 6/2020 | Miyoshi | .......... | H01J 37/32449 |
| 10,745,807 B2 * | 8/2020 | Wang | ................ | C23C 16/4401 |
| 10,804,079 B2 * | 10/2020 | Gregor | .................... | C23C 16/52 |
| 10,851,457 B2 * | 12/2020 | Shaikh | ............ | H01L 21/02164 |
| 2004/0140252 A1 * | 7/2004 | Gebauer | ................ | B01D 15/16 210/198.2 |
| 2006/0016559 A1 * | 1/2006 | Kobayashi | ............ | C23C 16/505 156/345.34 |
| 2006/0288934 A1 * | 12/2006 | Takahashi | ................. | C23F 4/00 118/715 |
| 2007/0181181 A1 * | 8/2007 | Mizusawa | ......... | C23C 16/45574 137/1 |
| 2007/0247075 A1 * | 10/2007 | Kim | ....................... | H01J 37/321 315/111.21 |
| 2007/0249173 A1 * | 10/2007 | Kim | .................. | H01J 37/32091 438/711 |
| 2007/0251642 A1 * | 11/2007 | Bera | ..................... | H01L 21/3065 156/345.26 |
| 2007/0251917 A1 * | 11/2007 | Bera | .................... | H01J 37/32449 216/58 |
| 2008/0073032 A1 | 3/2008 | Koshiishi et al. | | |
| 2008/0081114 A1 * | 4/2008 | Johanson | .......... | C23C 16/45565 427/273 |
| 2009/0117746 A1 * | 5/2009 | Masuda | ............ | H01L 21/67069 438/710 |
| 2009/0159213 A1 * | 6/2009 | Bera | ................. | H01J 37/3244 156/345.34 |
| 2009/0194235 A1 * | 8/2009 | Kobayashi | ........ | H01J 37/32449 156/345.28 |
| 2009/0272492 A1 * | 11/2009 | Katz | .................. | H01J 37/3244 156/345.34 |
| 2009/0275206 A1 * | 11/2009 | Katz | ................. | H01J 37/32449 438/714 |
| 2011/0256729 A1 * | 10/2011 | Goodlin | ............ | H01L 21/02104 438/758 |
| 2013/0315795 A1 * | 11/2013 | Bera | ....................... | B01J 19/26 422/310 |
| 2014/0291286 A1 * | 10/2014 | Okayama | .......... | C23C 16/45519 216/37 |
| 2015/0107772 A1 * | 4/2015 | Uchida | ............... | H01J 37/3244 156/345.33 |
| 2017/0178867 A1 * | 6/2017 | Kudela | ............. | H01J 37/3244 |
| 2018/0130640 A1 * | 5/2018 | Gregor | .............. | C23C 16/45565 |
| 2018/0163305 A1 * | 6/2018 | Batzer | ................ | H01J 37/3244 |
| 2018/0190519 A1 * | 7/2018 | Uchida | ............... | C23C 16/45563 |
| 2018/0374726 A1 * | 12/2018 | Miyoshi | .......... | H01L 21/67069 |
| 2019/0177846 A1 * | 6/2019 | Batzer | ............... | H01J 37/32743 |
| 2019/0371573 A1 * | 12/2019 | Gregor | ............... | H01J 37/32449 |
| 2020/0157682 A1 * | 5/2020 | Sung | ................... | C23C 16/509 |
| 2020/0219757 A1 * | 7/2020 | Breiling | ........... | H01L 21/67207 |

\* cited by examiner

GAS INJECTION MODULE, SUBSTRATE PROCESSING APPARATUS, AND METHOD OF FABRICATING SEMICONDUCTOR DEVICE USING THE SAME

PRIORITY STATEMENT

This is a Continuation of U.S. application Ser. No. 16/509,946, filed Jul. 12, 2019, and a claim of priority under 35 U.S.C § 119 is made to Korean Patent Application No. 10-2018-0144454 filed on Nov. 21, 2018, in the Korean Intellectual Property Office, the entire contents of which are hereby incorporated by reference.

BACKGROUND

The present inventive concepts relate to apparatus and methods of fabricating a semiconductor device, and more particularly, to gas injection system or module, a substrate processing apparatus, and a method of fabricating a semiconductor device using the same.

In general, semiconductor devices are manufactured by performing a plurality of unit processes. The unit processes may include a deposition process, a diffusion process, a thermal process, a photolithography process, a polishing process, an etching process, an ion implantation process, and a cleaning process. The etching process may be a dry etching process, a wet etching process or a combination of the two. The dry etching process may be performed in large part by plasma. Due to the plasma, a substrate may be treated at high temperature.

SUMMARY

According to one aspect of the present inventive concept, there is provided a gas injection system comprising a showerhead having first injection holes in a first region of the showerhead and second injection holes in a second region of the showerhead that is radially outwardly of the first region, a gas distributor on the showerhead and having first upper passages respectively connected to the first injection holes and second upper passages respectively connected to the second injection holes, and a flow rate controller configured to maintain pressure within the first upper passages relative to pressure in the second upper passages such that gas, introduced into the showerhead via the gas distributor, flows through the first injection holes at a rate similar to that at which gas flows through the second injection holes According to another aspect of the present inventive concept, there is provided a substrate processing apparatus comprising a chamber, a chuck in a lower portion of the chamber and dedicated to receive a substrate, and a gas injection system that provides into the chamber process gas used to process a substrate received by the chuck. The gas injection system includes a showerhead in an upper portion of the chamber, a gas distributor disposed on the showerhead, and a flow rate controller. The showerhead has first injection holes in a first region of the showerhead and second injection holes in a second region of the showerhead that is located radially outwardly of the first region. The gas distributor has first upper passages respectively connected to the first injection holes and second upper passages respectively connected to the second injection holes. The flow rate controller is configured to maintain pressure of gas within the first upper passages relative to pressure of gas within the second upper passages such that gas, introduced into the showerhead via the gas distributor, flows through the first injection holes at a rate similar to that at which it flows through the second injection holes.

According to still another aspect of the present inventive concept, there is provided a gas injection module, comprising a showerhead having first injection holes in a first region of the showerhead and second injection holes in a second region of the showerhead that is radially outwardly of the first region, a gas distributor disposed on and integral with the showerhead and having a first upper passage connected to the first injection holes and a second upper passage discrete from the first upper passage and connected to the second injection holes, a first pressure sensor in the first upper passage to detect a pressure of gas in the first upper passage, and a second pressure sensor in the second upper passage to detect a pressure of gas in the second upper passage.

According to yet another aspect of the present inventive concept, there is provided a method of fabricating a semiconductor device, comprising providing a substrate on a chuck in a chamber, using a gas injection module to provide a gas onto the substrate, the gas injection module having in an upper portion of the chamber first passages and second passages outside the first passages, detecting a pressure of the gas within the first and second passages of the gas injection module, determining whether or not the gas has a difference in pressure within the first and second passages, and controlling the gas to have a similar pressure within the first and second passages when it is determined that the gas has the difference in pressure within the first and second passages.

DETAILED DESCRIPTION

Figure 1:
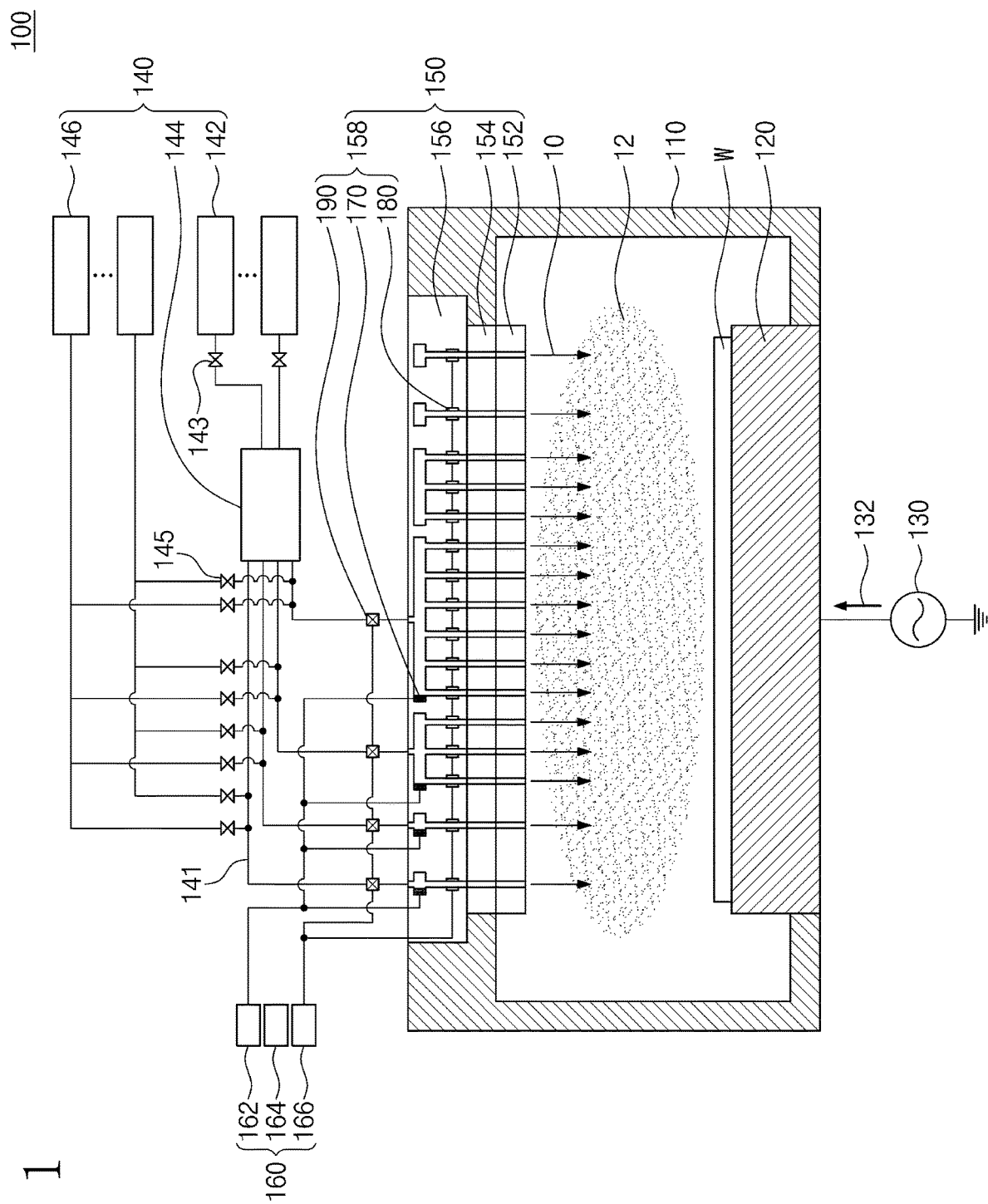
FIG. 1 is a schematic diagram of an example of a substrate processing apparatus according to the present inventive concepts.

Referring to FIG. 1, a capacitively coupled plasma (CCP) apparatus is shown as an example of a substrate processing apparatus 100 according to the present inventive concepts may be. The substrate processing apparatus 100 may include a chamber 110, a chuck 120, a power supply 130, a gas supply 140, a gas injection module 150, and a controller 160. A substrate W may be provided on the chuck 120 in the chamber 110. The power supply 130 may use high-frequency power 132 to create plasma 12 in the chamber 110. The gas supply 140 may supply a gas 10 to the gas injection module 150, which gas injection module 150 may provide the gas 10 into the chamber 110. The controller 160 may control a flow rate of the gas 10 and the high-frequency power 132 to manage a fabrication process, i.e., a processing of the substrate W.

The chamber 110 may provide a hermetic space that isolates the substrate W from the environment outside the chamber. Although not shown, the chamber 110 may include a lower housing and an upper housing on the lower housing. When the lower housing is separated from the upper housing, a robot arm may load the substrate W onto the chuck 120.

The chuck 120 may be installed in a lower portion of the chamber 110. The chuck 120 may use electrostatic voltage to hold the substrate W. The electrostatic voltage may be supplied through an electrostatic voltage supply that is disposed outside the chamber 110.

The power supply 130 may be connected to the chuck 120. The power supply 130 may supply the high-frequency power 132 to the chuck 120. The high-frequency power 132 may excite the gas 10 on the substrate W into a plasma state. That is, the high-frequency power 132 may create a plasma 12 of the gas 10.

The gas supply 140 may supply the gas 10 through the gas injection module 150 to the chamber 110. For example, the gas supply 140 includes first gas supplies 142, a mass flow controller 144, and second gas supplies 146. The first gas supplies 142 may supply the gas injection module 150 with a main constituent (e.g., Ar, $N_2$, or $SF_6$) of the gas 10. Each of the first gas supplies 142 may have a flow control valve 143. The mass flow controller 144 may be disposed between the first gas supplies 142 and the gas injection module 150. The mass flow controller 144 may control a mass flow of the main gas. The second gas supplies 146 may be connected to pipes 141 between the mass flow controller 144 and the gas injection module 150. The second gas supplies 146 may have their subsidiary valves 145 connected to the pipes 141 between the mass flow controller 144 and the gas injection module 150. The second gas supplies 146 may provide the gas injection module 150 with an additional constituent (e.g., $O_2$, $C_4F_6$, or $C_4F_8$) of the gas 10.

The gas injection module 150 may be installed in an upper portion of the chamber 110. The gas injection module 150 may provide the gas 10 onto the substrate W. The gas 10 within the gas injection module 150 may have a lower pressure than that of the gas 10 within the pipes 141 between the mass flow controller 144 and the gas injection module 150.

Figure 2:
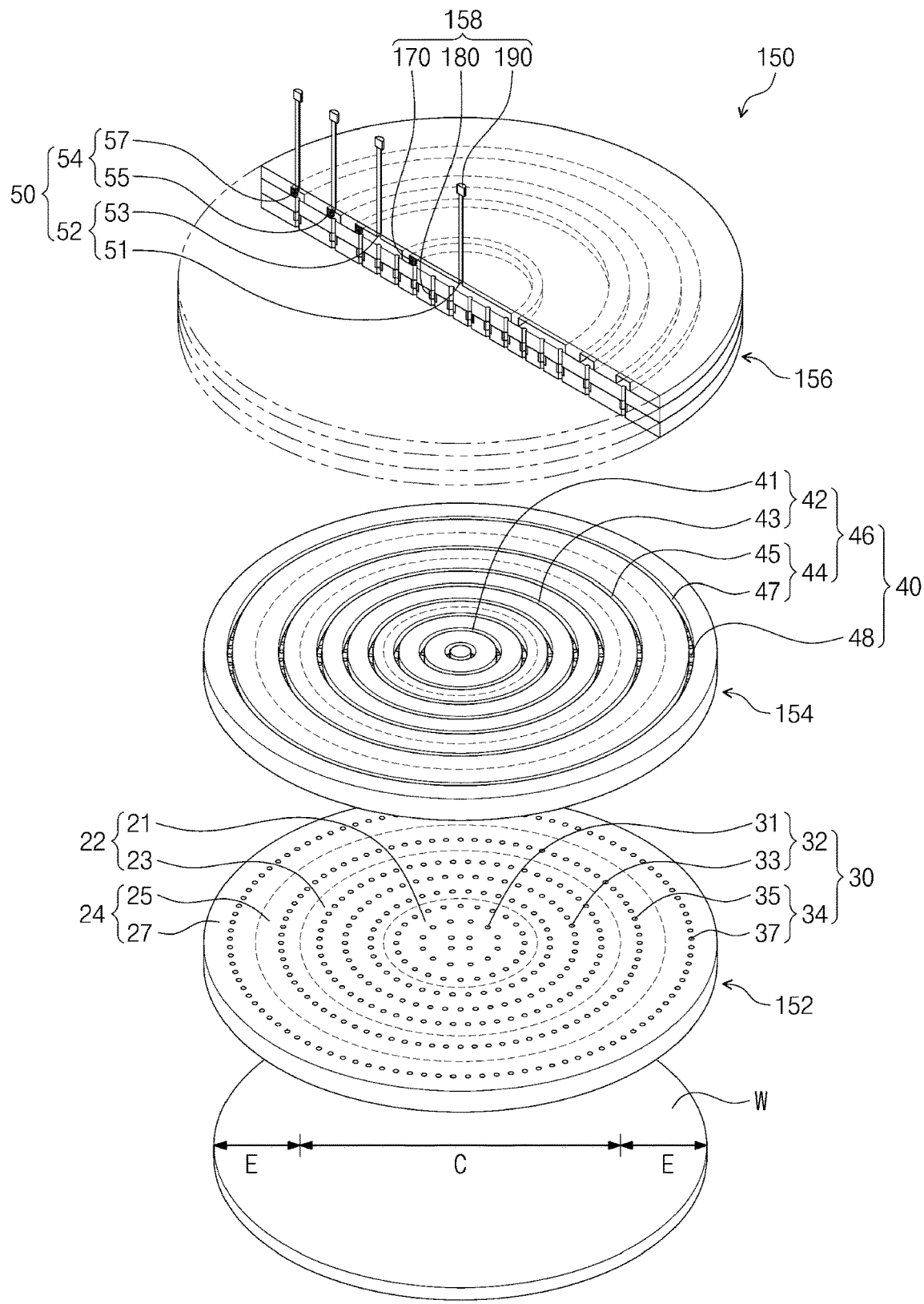
FIG. 2 is an exploded view, in perspective, of an example of a gas injection module of the substrate processing apparatus shown in FIG. 1.

FIG. 2 illustrates an example of the gas injection module 150 shown in FIG. 1.

Referring to FIGS. 1 and 2, the gas injection module 150 may include a showerhead 152, a first distribution plate 154, a second distribution plate 156 (or "gas distributor"), and a flow rate adjuster 158.

The showerhead 152 may include a plurality of injection holes 30. The gas 10 may be sprayed onto the substrate W through the injection holes 30. Each of the injection holes 30 may have a diameter of about 0.5 mm to about 1 mm. When the showerhead 152 is initially used, the injection holes 30 may have the same size (e.g., diameter). In addition, the gas 10 may have similar flow rates within the injection holes 30. The arrangement of the injection holes 30 may correspond to the shape of the substrate W. For example, when the substrate W is circular, the injection holes 30 may be arranged (laid out) along a series of concentric circles. The showerhead 152 may have regions, e.g., a first region 22 and a second region 24, associated with corresponding regions of the substrate W. The first region 22 may correspond to a central region C of the substrate W, and the second region 24 may correspond to an edge (outer peripheral) region E of the substrate W. The first region 22 may include a central portion 21 and a middle portion 23 of the showerhead 152. The second region 24 may be disposed outside or around the first region 22. The second region 24 may include an a radially outer portion 25 and a radially outermost portion 27 of the showerhead 152. The injection holes 30 may be regularly and evenly arranged in the first and second regions 22 and 24. The injection holes 30 may include, for example, first injection holes 32 and second injection holes 34 disposed in the first region 22 and second injection holes 34 disposed in the second region 24.

The first injection holes 32 may include central injection holes 31 and middle injection holes 33. The central injection holes 31 may be arranged along several rings. For example, a number (e.g., 4) of the central injection holes 31 may be arranged along a first ring, a number (e.g., 12) of the central injection holes 31 second ring, and a number (e.g., 24) of the central injection holes 31 may be arranged along a third ring. The middle injection holes 33 may be disposed outside or around the central injection holes 31. The middle injection holes 33 may include a number (e.g., 36) of holes arranged along a fourth ring, a number (e.g., 48) of holes arranged along a fifth ring, and a number (e.g., 60) of holes arranged along a sixth ring.

The second injection holes 34 may be disposed outside or around the middle injection holes 33. The second injection holes 34 may include radially outer injection holes 35 and radially outermost injection holes 37. The radially outer injection holes 35 (e.g., 80 holes) may be arranged along a seventh ring. The radially outermost injection holes 37 may be disposed outside or around the radially outer injection holes 35. The radially outermost injection holes 37 (e.g., 100 holes) may be arranged along an eighth ring.

Figure 3:
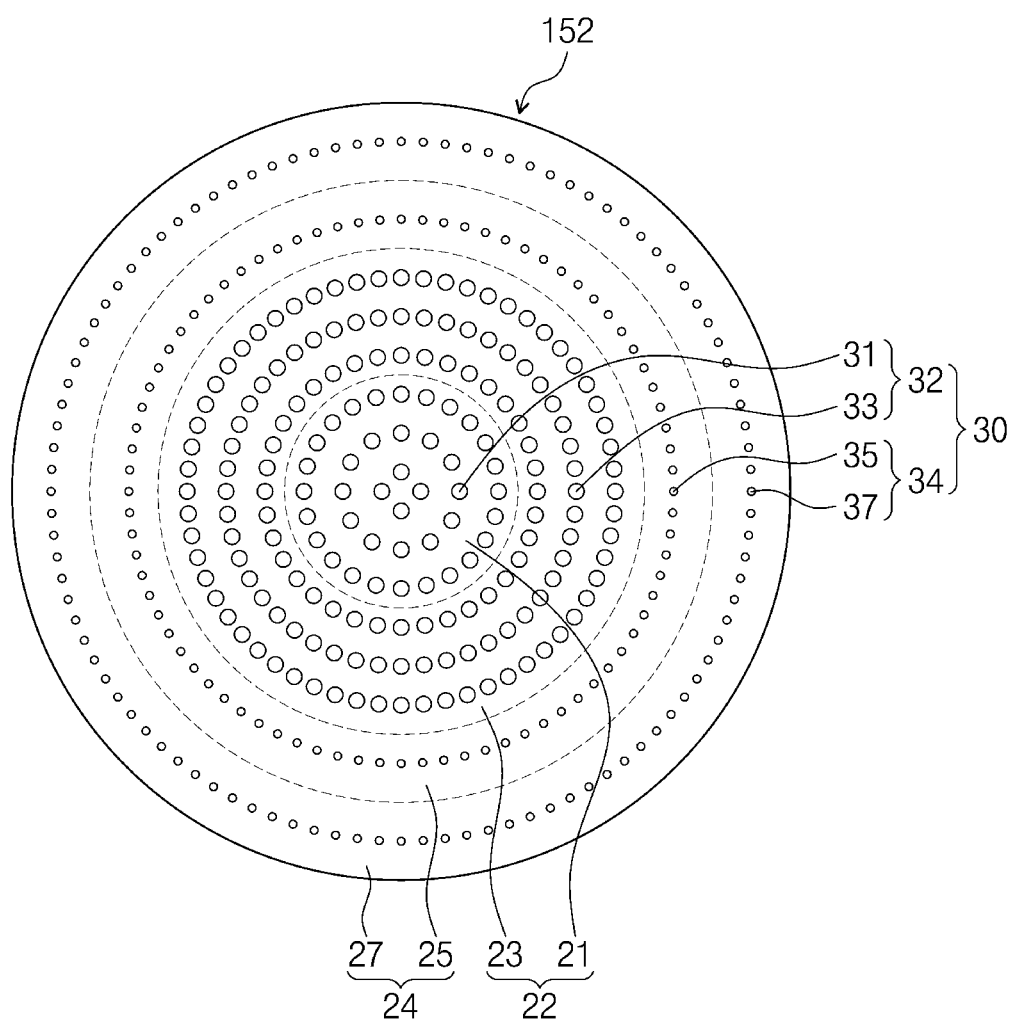
FIG. 3 is a plan view of an example of a showerhead of the gas injection module shown in FIG. 2.

FIG. 3 illustrates an example of the showerhead 152 shown in FIG. 2.

Referring to FIGS. 1 and 3, because the plasma 12 has a greater density on the central region 21 than on the second region 24 of the showerhead 152, the plasma 12 may cause the first injection holes 32 to expand and become wider. Thus, when the showerhead 152 is used for a certain amount of time, the first injection holes 32 can become bigger than the second injection holes 34. In other cases the second injection holes 34 may become bigger than the first injection holes 32. That is, use of the showerhead 152 may create a difference in size between the first and second injection holes 32 and 34. When the difference in size occurs between the first injection holes 32 and the second injection holes 34, the gas 10 within the first and second injection holes 32 and 34 may have different flow rates. When the gas 10 travels at different flow rates within the first and second injection holes 32 and 34, the etch uniformity of the substrate W may be compromised.

Figure 4:
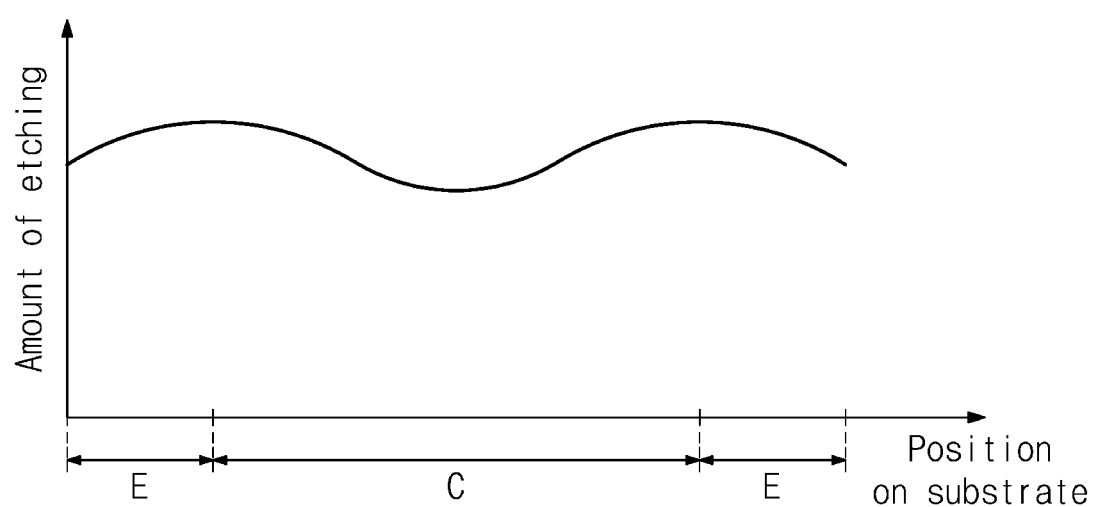
FIG. 4 is a graph showing an etch uniformity of a substrate processed by a substrate processing apparatus according to the present inventive concepts as shown in FIG. 1.

FIG. 4 illustrates an etch uniformity of the substrate W when processed using the apparatus shown in FIG. 1.

Referring to FIG. 4, when the first injection holes 32 become bigger than the second injection holes 34, the outer peripheral region E of the substrate W may be etched to a greater extent than the central region C. This may be caused by the gas 10 within the first injection holes 32 traveling at a flow rate less than that of the gas 10 within the second injection holes 34. This may also be caused due to a difference in pressure of the gas 10 in the first and second injection holes 32 and 34.

Mechanisms and techniques of controlling the gas 10 to have similar pressures and/or flow rates within the gas injection module 150, with an aim towards maximizing etch uniformity of the substrate W according to an aspect of the inventive concept, will now be described in detail. Here, and in the description that follows, the term "similar" is used to mean the same and yet account for any minor differences within a predetermined allowable margin of error given the level of precision that can be provided by elements of a flow controller as will be described below in more detail.

Referring back to FIG. 2, the first distribution plate 154 may be disposed on the showerhead 152. The first distribution plate 154 may have a plurality of lower passages 40. The lower passages 40 may be connected to the injection holes 30. The gas 10 may be provided through the lower passages 40 to the injection holes 30. For example, the lower passages 40 may have the shape of concentric circles. The lower passages 40 may include lower grooves 46 and lower holes 48 open to the lower grooves 46 at the bottom of the lower grooves 46. The lower holes 48 may be aligned with the injection holes 30. The lower grooves 46 may be disposed directly on the injection holes 30.

The lower grooves 46 may include first lower grooves 42 and second lower grooves 44. The first lower grooves 42 may be disposed on the first injection holes 32. The first lower grooves 42 may include lower central grooves 41 and lower middle grooves 43. The second lower grooves 44 may be disposed outside or around the first lower grooves 42. The second lower grooves 44 may include a lower radially outer groove 45 and a lower radially outermost groove 47.

The second distribution plate 156 may be disposed on the first distribution plate 154. The second distribution plate 156 may have a plurality of upper passages 50. The upper passages 50 may be connected to, i.e., in open communication with, the lower passages 40. The gas 10 may be provided through the upper passages 50 to the lower passages 40.

The upper passages 50 may include first upper passages 52 and second upper passages 54. The first upper passages 52 may be disposed in the first region 22. The first upper passages 52 may include an upper central passage 51 and an upper middle passage 53. The upper central passage 51 may be disposed in the central region 21. The upper middle passage 53 may be disposed in the middle region 23. The second upper passages 54 may be disposed outside or around the first upper passages 52. The second upper passages 54 may include an upper radially outer passage 55 and an upper radially outermost passage 57. The upper radially outer 55 may be disposed in the radially outer region 25, and the upper radially outermost passage 57 may be disposed in the radially outermost region 27.

Figure 5:
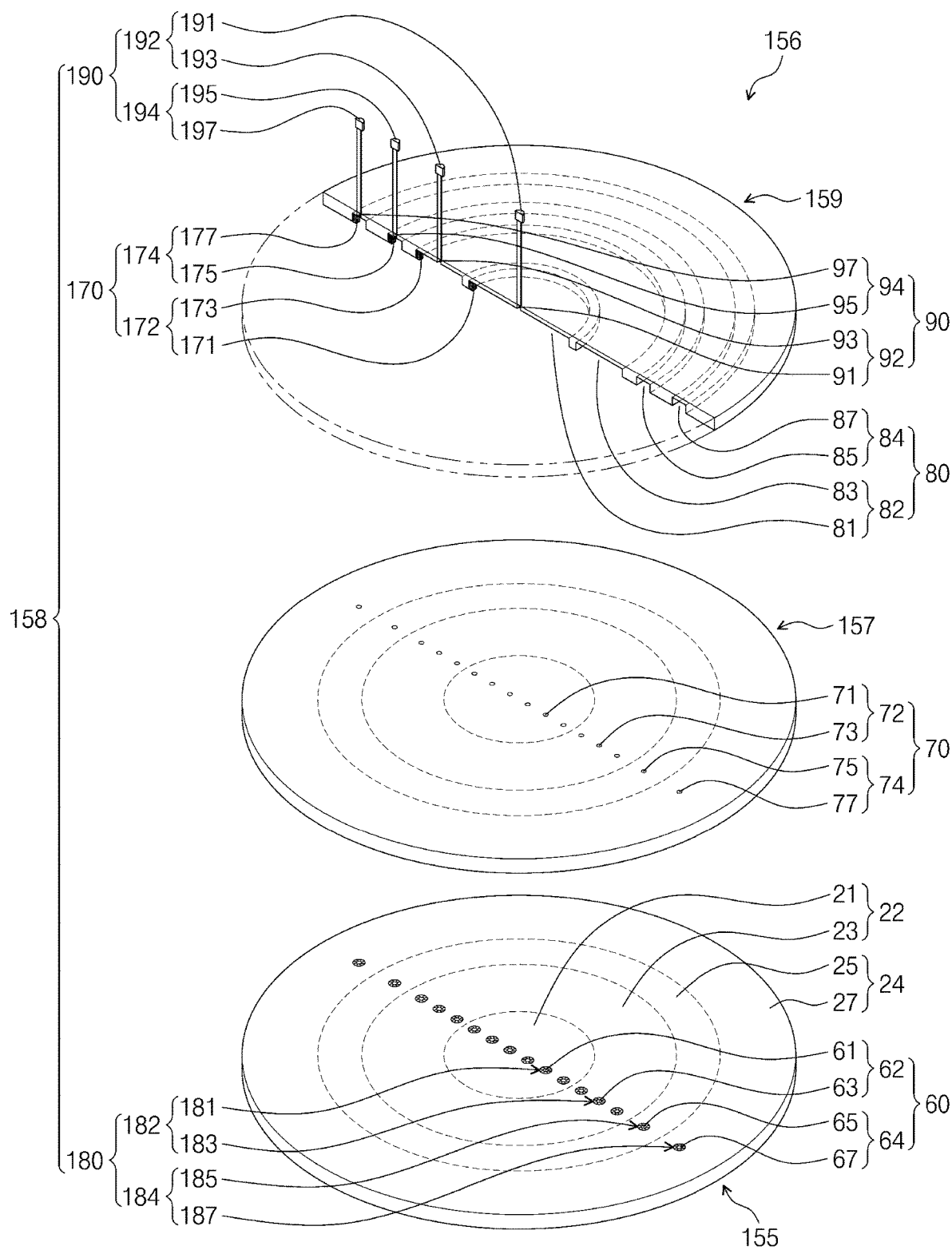
FIG. 5 is an exploded view, in perspective, of an example of a second distribution plate of the gas injection module shown in FIG. 2.

FIG. 5 illustrates an example of the second distribution plate 156 shown in FIG. 2.

Referring to FIG. 5, the second distribution plate 156 may include a lower plate 155, an intermediate plate 157, and an upper plate 159.

Referring to FIGS. 2 and 5, the lower plate 155 may be disposed on the first distribution plate 154. The lower plate 155 may include lower holes 60. The lower holes 60 may be connected to the lower passages 40. The lower holes 60 may include first lower holes 62 and second lower holes 64. The first lower holes 62 may be disposed in the first region 22, and the second lower holes 64 may be disposed in the second region 24. The first lower holes 62 may include lower central holes 61 and lower middle holes 63. The lower central holes 61 may be disposed in the central region 21, and the lower middle holes 63 may be disposed in the middle region 23. The second lower holes 64 may be disposed outside or around the first lower holes 62. The second lower holes 64 may include lower radially outer holes 65 and lower radially outermost holes 67. The lower radially outer holes 65 may be disposed in the radially outer region 25. The lower radially outermost holes 67 may be disposed in the radially outermost region 27.

The intermediate plate 157 may be disposed on the lower plate 155. The intermediate plate 157 may include intermediate holes 70. The intermediate holes 70 may be connected to the lower holes 60. The intermediate holes 70 may include first intermediate holes 72 and second intermediate holes 74. The first intermediate holes 72 may be disposed in the first region 22, and the second intermediate holes 74 may be disposed in the second region 24. The first intermediate holes 72 may include intermediate central holes 71 and intermediate middle holes 73. The intermediate central holes 71 may be disposed in the central region 21, and the intermediate middle holes 73 may be disposed in the middle region 23. The second intermediate holes 74 may be disposed outside or around the first intermediate holes 72. The second intermediate holes 74 may include intermediate radially outer holes 75 and intermediate radially outermost holes 77. The intermediate radially outer holes 75 may be disposed in the radially outer region 25, and the intermediate radially outermost holes 77 may be disposed in the radially outermost region 27.

The upper plate 159 may be disposed on the intermediate plate 157. The upper plate 159 may include upper grooves 80 and introduction holes 90 on the upper grooves 80.

The upper grooves 80 may be connected to the intermediate holes 70. The upper grooves 80 may have the shape of concentric circles. The upper grooves 80 may include first upper grooves 82 and second upper grooves 84. The first and second upper grooves 82 and 84 may be respectively disposed in the first and second regions 22 and 24. The first upper grooves 82 may include an upper central groove 81 and an upper middle groove 83. The upper central groove 81 may be disposed in the central region 21, and the upper middle groove 83 may be disposed in the middle region 23. The second upper grooves 84 may be disposed outside or around the first upper grooves 82. The second upper grooves 84 may include an upper radially outer groove 85 and an upper radially outermost groove 87. The upper radially outer groove 85 may be disposed in the radially outer region 25, and the upper radially outermost groove 87 may be disposed in the radially outermost region 27.

The introduction holes 90 may be connected to the pipes 141 of the mass flow controller 144 shown in FIG. 1. The introduction holes 90 may include first introduction holes 92 and second introduction holes 94. The first introduction holes 92 may be connected to the first upper grooves 82. The first introduction holes 92 may include a central introduction hole 91 and a middle introduction hole 93. The central introduction hole 91 may be connected to the upper central groove 81. The middle introduction hole 93 may be connected to the upper middle groove 83. The second introduction holes 94 may be disposed outside or around the first introduction holes 92. The second introduction holes 94 may include a radially outer introduction hole 95 and a radially outermost introduction hole 97. The radially outer introduction hole 95 may be connected to the upper radially outer groove 85. The radially outermost introduction hole 97 may be connected to the upper radially outermost groove 87.

Referring to FIGS. 1, 2, and 5, the flow rate adjuster 158 may detect pressure of the gas 10 within the first upper passages 52 and the second upper passages 54 of the second distribution plate 156. Based on the detected pressure, the flow rate adjuster 158 may reduce a difference in pressure between the gas 10 within the first upper passages 52 and the gas 10 within the second upper passages 54, such that the gas 10 has similar (the same or substantially the same) flow rates within the first and second injection holes 32 and 34. For example, the flow rate adjuster 158 may include pressure sensors 170, lower valves 180, and upper valves 190. Controller 160 together with the flow rate adjuster 158 (pressure sensors 170 and lower and/or upper valves 180 and 190, for example) may constitute a flow rate controller of a gas injection system according to the inventive concept.

The pressure sensors 170 may be installed in the upper grooves 80 and, in particular, on surfaces defining the sides of the upper grooves 80. The pressure sensors 170 may detect a pressure of the gas 10 within the upper grooves 80.

The pressure sensors 170 may include first pressure sensors 172 and second pressure sensors 174. The first pressure sensors 172 may be disposed in the first upper grooves 82, and may detect a pressure of the gas 10 within the first upper grooves 82. The first pressure sensors 172 may include a central sensor 171 and a middle sensor 173. The central sensor 171 may be disposed in the upper central groove 81, and may detect a pressure of the gas 10 within the upper central groove 81. The middle sensor 173 may be disposed in the upper middle groove 83, and may detect a pressure of the gas 10 within the upper middle groove 83.

The second pressure sensors 174 may be disposed in the second upper grooves 84, and may detect a pressure of the gas 10 within the second upper grooves 84. The second pressure sensors 174 may include a radially outer sensor 175 and a radially outermost sensor 177. The radially outer sensor 175 may be disposed in the upper radially outer groove 85, and may detect a pressure of the gas 10 within the upper radially outer groove 85. The radially outermost sensor 177 may be disposed in the upper radially outermost groove 87, and may detect a pressure of the gas 10 within the upper radially outermost groove 87.

The lower valves 180 may be installed below the pressure sensors 170. For example, the lower valves 180 may be disposed in the lower holes 60, respectively. The lower valves 180 may control the flow rates of the gas 10 within the lower holes 60. For example, the lower valves 180 may be orifice valves, i.e., valves that have an orifice whose size (diameter or width) is adjustable. When the lower valves 180 open (e.g., when orifices of the lower valves 180 become wider), the flow rate of gas 10 within the lower holes 60 increases. When the lower valves 180 close (e.g., when orifices of the lower valves 180 become narrower), the flow rate of gas 10 within the lower holes 60 decreases.

The lower valves 180 may include first lower valves 182 and second lower valves 184. The first lower valves 182 may be disposed in the first lower holes 62, and may control the flow rate of the gas 10 within the first lower holes 62. The first lower valves 182 may include lower central valves 181 and lower middle valves 183. The lower central valves 181 may be disposed in the lower central holes 61, and may control the flow rate of the gas 10 within the lower central holes 61. The lower middle valves 183 may be disposed in the lower middle holes 63, and may control the flow rate of the gas 10 within the lower middle holes 63. The second lower valves 184 may be disposed in the second lower holes 64, and may control the flow rate of the gas 10 within the second lower holes 64.

The second lower valves 184 may include lower radially outer valves 185 and lower radially outermost valves 187. The lower radially outer valves 185 may be disposed in the lower radially outer holes 65, and may control the flow rate of the gas 10 within the lower radially outer holes 65. The lower radially outermost valves 187 may be disposed in the lower radially outermost holes 67, and may control the flow rate of the gas 10 within the lower radially outermost holes 67.

The upper valves 190 may be installed above the pressure sensors 170. For example, the upper valves 190 may be connected between the mass flow controller 144 and the introduction holes 90 of the upper plate 159. The upper valves 190 may be orifice valves.

The upper valves 190 may include first upper valves 192 and second upper valves 194. The first upper valves 192 may be connected to (i.e., may be disposed in-line with) the first introduction holes 92, and may control the flow rate of the gas 10 within the first introduction holes 92. The first upper valves 192 may include an upper central valve 191 and an upper middle valve 193. The upper central valve 191 may be connected to the central introduction hole 91, and may control the flow rate of the gas 10 within the central introduction hole 91. The upper middle valve 193 may be connected to the middle introduction hole 93, and may control the flow rate of the gas 10 within the middle introduction hole 93. The second upper valves 194 may be connected to the second introduction holes 94, and may control the flow rate of the gas 10 within the second introduction holes 94. The second upper valves 194 may include an upper radially outer valve 195 and an upper radially outermost valve 197. The upper radially outer valve 195 may be connected to the radially outer introduction hole 95, and may control the flow rate of the gas 10 within the radially outer introduction hole 95. The upper radially outermost valve 197 may be connected to the radially outermost introduction hole 97, and may control the flow rate of the gas 10 within the radially outermost introduction hole 97.

The controller 160 may be connected to the pressure sensors 170, the lower valves 180, and the upper valves 190. The controller 160 may receive information of the pressures of the gas 10 within the upper grooves 80, may compare the pressures of the gas 10 with each other, and based on the compared pressures, may control the flow rate of the gas 10. To this end, the controller 160 may include a pressure signal detector 162, a comparator 164, and a valve controller 166. As is traditional in the field of controllers related to the inventive concepts, the blocks of the controller 160, e.g., the pressure signal detector 162, comparator 164, valve controller 166, may be physically implemented by analog and/or digital circuits. The circuits constituting a block may be implemented by dedicated hardware, by one or more programmed processors (e.g., microprocessor(s)) and associated circuitry, or by a combination of dedicated hardware to perform some functions of the block and a processor to perform other functions of the block.

The detector 162 may be connected to the pressure sensors 170 so as to receive signals from the pressure sensors 170, i.e., to receive information of the pressures of the gas 10 within the gas injection module 150 as sensed by the pressure sensors 170. The detector 162 may convert the output of the pressure sensors 170 into signals representative of the values of pressures of the gas 10 within the gas injection module 150.

The comparator 164 may compare the signals generated by the detector 162. Based on the compared signals, the comparator 164 may determine whether the size of any or certain ones of the injection holes 30 has changed to such an extent that a difference in size exists between respective ones of the injection holes 30.

The valve controller 166 may control the lower valves 180 and the upper valves 190 in such a manner that the gas 10 has similar (the same or substantially the same) pressures within respective regions of the gas injection module 150. Likewise, the valve controller 166 may be configured to control the lower valves 180 and the upper valves 190 in such a manner that the gas 10 flows at similar rates within respective regions of the gas injection module 150.

For example, when the comparator 164 determines that the pressure of the gas 10 in the first region 22 is lower than that of the gas 10 in the second region 24, the valve controller 166 may control the first upper valves 192 to open wider than the second upper valves 194. When the first upper valves 192 are controlled to open wider than the second upper valves 194, the pressure of gas 10 in in the first region 22 increases. When the pressure of the gas 10 in the first region 22 increases, the pressure of the gas 10 in the first and second regions 22 and 24 may equalize, i.e., become similar. In addition, the gas 10 may flow at similar rates within the first and second injection holes 32 and 34. Accordingly, the substrate W may be processed uniformly across the surface thereof, e.g., the etch uniformity of a process of etching the substrate W may be high.

When the comparator 164 determines that the pressure of the gas 10 in the first region 22 is lower than that of the gas 10 in the second region 24, the flow rate controller 166 may control the second lower valves 184 of the second region 24 to close to a greater extent than the first lower valves 182 of the first region 22. In this case the pressure of the gas 10 in the second region 24 is reduced. Accordingly, the pressures of the gas 10 in the first and second regions 22 and 24 may equalize and become similar pressure. Likewise, the rates at which the gas 10 flows within the first and second injection holes 32 and 34 may become similar.

An example of a method of processing a substrate in the fabricating of a semiconductor device according to the present inventive concepts will now be described with reference to FIGS. 1 and 6.

Figure 6:
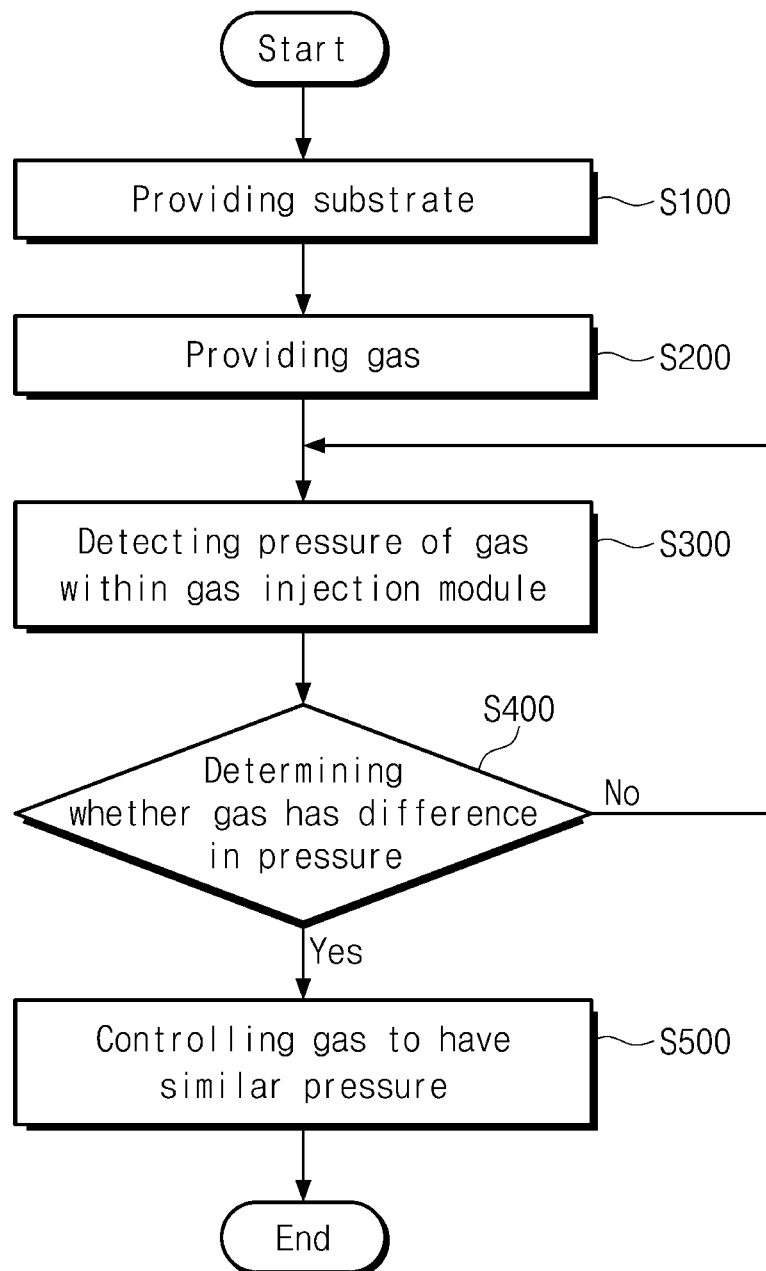
FIG. 6 is a flow chart illustrating an example of a method of fabricating a semiconductor device according to the present inventive concepts.

Referring to FIGS. 1 and 6, a method of fabricating a semiconductor device according to the present inventive concepts may include providing the substrate W (S100), providing the gas 10 (S200), detecting a pressure of the gas 10 within the gas injection module 150 (S300), determining whether a difference in pressure exists among different regions of the gas 10 (S400), and controlling the gas 10 such that the different regions of the gas have similar (the same or substantially the same) pressures (S500).

A robot arm (not shown) may load the substrate W onto the chuck 120 in a processing space of the chamber 110 (S100).

The gas injection module 150 may provide the gas 10 to a processing space within the chamber 110 (S200). The power supply 130 may supply the high-frequency power 132 to create the plasma 12. The plasma 12 may etch the substrate W. Alternatively, a thin layer may be deposited on the substrate W using the plasma 12.

The detection controller 162 may use the pressure sensors 170 to detect a pressure of the gas 10 within the gas injection module 150 (S300).

The pressure comparison controller 164 may compare pressures of the gas 10 within different regions of the gas injection module 150 to determine whether a difference in gas pressure exists within respective regions of the gas injection module 150 (S400). When there is no pressure difference in the gas 10 among the respective regions of the gas injection module 150, no action is taken. However, the detection controller 162 may continue to periodically detect the pressure of the gas 10 within the respective regions of the gas injection module 150 (S300).

On the other hand, when a difference in gas pressure is detected, the flow rate controller 166 controls the lower valves 180 and the upper valves 190 to equalize the pressure of the gas 10 within the gas injection module 150 (S500).

According to the present inventive concepts, a gas injection module has a flow rate controller that reduces a difference in pressure resulting from a difference in size of injection holes between central and outer peripheral areas of a showerhead, with the result that a substrate may be processed (etched or have a thin film formed thereon) uniformly.

Although the present inventive concepts have been described in connection with the examples illustrated in the accompanying drawings, it will be understood to those skilled in the art that various changes and modifications may be made to such examples without departing from the technical spirit and scope of the present inventive concepts. It therefore will be understood that the examples described above are just illustrative but not limitative in all aspects of the inventive concept as defined by the appended claims.

What is claimed is:

1. A method of fabricating a semiconductor device, the method comprising:
   providing a substrate in a chamber;
   supplying a gas in the chamber;
   providing the gas on the substrate using a gas injection system coupled with the chamber,
   wherein the gas injection system comprises:
   a showerhead having first injection holes in a first region of the showerhead and second injection holes in a second region of the showerhead, the second region being radially outwardly of the first region;
   a gas distributor above the showerhead and having first upper passages respectively connected to the first injection holes and second upper passages respectively connected to the second injection holes; and
   a flow rate controller configured to maintain pressure within the first upper passages relative to pressure in the second upper passages such that gas, introduced into the showerhead via the gas distributor, flows through the first injection holes at a rate similar to that at which gas flows through the second injection holes,
   wherein the flow rate controller includes first pressure sensors disposed in the first upper passages, respectively, and second pressure sensors disposed in the second upper passages, respectively, to detect pressures of the gas within the first upper passages and the second upper passages, and
   wherein the gas distributor includes
   a lower plate having first lower holes connected to the first injection holes and second lower holes connected to the second injection holes, and
   an upper plate having first grooves overlying the first lower holes and second grooves overlying the second lower holes,
   wherein the first pressure sensors are disposed in the first grooves and the second pressure sensors are disposed in the second grooves.

2. The method of claim 1, further comprising detecting a pressure of the gas within the first upper passages and the second upper passages using the first sensors and the second sensors.

3. The method of claim 2, further comprising:
   determining whether or not the gas has a difference in pressure within the first upper passages and the second upper passages; and controlling the gas to have a similar pressure within the first upper passages and the second upper passages when it is determined that the gas has the difference in pressure within the first upper passages and the second upper passages.

4. The method of claim 1, wherein the flow rate controller further includes first lower valves in the first lower holes below the first pressure sensors, and second lower valves in the second lower holes below the second pressure sensors.

5. The method of claim 1, wherein the upper plate further has first introduction holes on the first grooves and second introduction holes on the second grooves.

6. The method of claim 5, wherein the flow rate controller further includes first upper valves connected to the first introduction holes and disposed above the first pressure sensors, and second upper valves connected to the second introduction holes and disposed above the second pressure sensors.

7. The method of claim 1, wherein the gas distributor further includes an intermediate plate having first intermediate holes extending between the first injection holes and the first grooves, and second intermediate holes extending between the second injection holes and the second grooves.

8. The method of claim 1, wherein the first region has a central section and a middle section radially outwardly of the central section, and
the first pressure sensors include a central sensor in the central section and a middle sensor in the middle section.

9. The method of claim 1, wherein the second region of the showerhead has a radially outer part and a radially outermost part radially outwardly of the radially outer part, and
the second pressure sensors include a radially outer pressure sensor in the radially outer part of the second region of the showerhead and a radially outermost pressure sensor in the radially outermost part of the second region of the showerhead.

10. The method of claim 1, further comprising a distribution plate interposed between the showerhead and the gas distributor,
wherein the distribution plate has first lower passages extending between the first injection holes and the first upper passages, and second lower passages extending between the second injection holes and the second upper passages.

11. A method of fabricating a semiconductor device, the method comprising:
providing a substrate on a chuck in a chamber;
supplying a gas using a gas supply connected to the chamber;
providing the gas on the substrate using a gas injection system between the gas supply and the chamber;
providing a radio frequency power into the chuck configured to generate plasma on the substrate,
wherein the gas injection system comprises:
a showerhead having first injection holes in a first region of the showerhead and second injection holes in a second region of the showerhead, the second region being radially outwardly of the first region;
a gas distributor above the showerhead and having first upper passages respectively connected to the first injection holes and second upper passages respectively connected to the second injection holes; and
a flow rate controller configured to maintain pressure within the first upper passages relative to pressure in the second upper passages such that gas, introduced into the showerhead via the gas distributor, flows through the first injection holes at a rate similar to that at which gas flows through the second injection holes,
wherein the flow rate controller includes first pressure sensors disposed in the first upper passages, respectively, and second pressure sensors disposed in the second upper passages, respectively, to detect pressures of the gas within the first upper passages and the second upper passages, and
wherein the gas distributor includes
a lower plate having first lower holes connected to the first injection holes and second lower holes connected to the second injection holes, and
an upper plate having first grooves overlying the first lower holes and second grooves overlying the second lower holes,
wherein the first pressure sensors are disposed in the first grooves and the second pressure sensors are disposed in the second grooves.

12. The method of claim 11, wherein the gas supply includes:
a first gas source that supplies a first gas;
a mass flow rate controller disposed in-line between the first gas source and the gas distributor so as to control a mass flow rate of the first gas; and
a second gas source disposed in-line between the mass flow rate controller and the gas distributor so as to supply the gas distributor with a second gas different from the first gas.

13. The method of claim 11, wherein the first region has a central section and a middle section radially outwardly of the central section, and
the first pressure sensors include a central sensor in the central section and a middle sensor in the middle section.

14. The method of claim 1, wherein the second region of the showerhead has a radially outer part and a radially outermost part radially outwardly of the radially outer part, and
the second pressure sensors include a radially outer pressure sensor in the radially outer part of the second region of the showerhead and a radially outermost pressure sensor in the radially outermost part of the second region of the showerhead.

15. The method of claim 11, wherein the flow rate controller comprises:
a pressure signal detector connected to the first pressure sensors and to the second pressure sensors and operative to convert output of the first pressure sensors and the second pressure sensors into signals representative of values of pressures of the gas within the first upper passages and the second upper passages, and
a comparator operatively connected to the pressure signal detector and configured to compare values of pressures of the gas within the first upper passages with values of pressures of the gas within second passages.

16. A method of fabricating a semiconductor device, the method comprising:
providing a substrate on a chuck in a chamber;
using a gas injection module to provide a gas onto the substrate, the gas injection module having, in an upper portion of the chamber, first passages and second passages outside the first passages;
detecting a pressure of the gas within the first passages and the second passages of the gas injection module;

determining whether or not the gas has a difference in pressure within the first passages and the second passages; and controlling the gas to have a similar pressure within the first passages and the second passages when it is determined that the gas has the difference in pressure within the first passages and the second passages, wherein the gas injection module comprises:

a showerhead having first injection holes in a first region of the showerhead and second injection holes in a second region of the showerhead, the second region being radially outwardly of the first region;

a gas distributor above the showerhead and having the first passages respectively connected to the first injection holes and the second passages respectively connected to the second injection holes; and a flow rate controller configured to maintain pressure within the first passages relative to pressure in the second passages such that gas, introduced into the showerhead via the gas distributor, flows through the first injection holes at a rate similar to that at which gas flows through the second injection holes, wherein the flow rate controller includes first pressure sensors disposed in the first passages, respectively, and second pressure sensors disposed in the second passages, respectively, to detect pressures of the gas within the first passages and the second passages, and wherein the gas distributor includes a lower plate having first lower holes connected to the first injection holes and second lower holes connected to the second injection holes, and an upper plate having first grooves overlying the first lower holes and second grooves overlying the second lower holes, wherein the first pressure sensors are disposed in the first grooves and the second pressure sensors are disposed in the second grooves.

17. The method of claim 16, wherein the flow rate controller further includes first lower valves in the first lower holes below the first pressure sensors, and second lower valves in the second lower holes below the second pressure sensors.

18. The method of claim 17, wherein the flow rate controller further comprises:

a pressure signal detector connected to the first pressure sensors and to the second pressure sensors and operative to convert output of the first pressure sensors and the second pressure sensors into signals representative of values of pressures of the gas within the first passages and the second passages, and a comparator operatively connected to the pressure signal detector and configured to compare values of pressures of the gas within the first passages with values of pressures of the gas within second passages.

19. The method of claim 18, wherein the flow rate controller further includes a valve controller operatively connected to the comparator and the first lower valves and the second lower valves so as to control the first lower valves and the lower second valves based on a comparison of pressures by the comparator.

20. The method of claim 16, wherein the upper plate further has first introduction holes on the first grooves and second introduction holes on the second grooves.

* * * * *